US010147686B1

(12) United States Patent
Lessard et al.

(10) Patent No.: US 10,147,686 B1
(45) Date of Patent: Dec. 4, 2018

(54) TRANSISTOR WITH SHIELD STRUCTURE, PACKAGED DEVICE, AND METHOD OF MANUFACTURE (71) Applicant: NXP USA, INC., Austin, TX (US)

(72) Inventors: Charles John Lessard, Gilbert, AZ (US); Damon G. Holmes, Scottsdale, AZ (US); David Cobb Burdeaux, Tempe, AZ (US); Hernan Rueda, Chandler, AZ (US); Ibrahim Khalil, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/715,623

(22) Filed: Sep. 26, 2017

(51) Int. Cl.
H01L 23/58 (2006.01)
H01L 23/552 (2006.01)
H01L 23/66 (2006.01)
H01L 23/48 (2006.01)
H01L 23/528 (2006.01)
H01L 23/522 (2006.01)
H01L 21/768 (2006.01)
H01L 29/78 (2006.01)
(Continued)

(52) U.S. Cl.
CPC ...... H01L 23/552 (2013.01); H01L 21/76877 (2013.01); H01L 23/481 (2013.01); H01L 23/528 (2013.01); H01L 23/5226 (2013.01); H01L 23/66 (2013.01); H01L 29/78 (2013.01); H01L 2223/6616 (2013.01); H01L 2223/6655 (2013.01); H03F 1/0288 (2013.01); H03F 3/195 (2013.01); H03F 2200/222 (2013.01); H03F 2200/225 (2013.01); H03F 2200/387 (2013.01); H03F 2200/391 (2013.01); H03F 2200/451 (2013.01)

(58) Field of Classification Search
CPC . H01L 23/552; H01L 29/78; H01L 21/76877; H01L 23/5226; H01L 23/528; H01L 23/481; H01L 23/66; H01L 2223/6655; H03F 2200/391; H03F 2200/387; H03F 2200/222; H03F 2200/451; H03F 3/195; H03F 1/00
USPC ........................................................ 257/386
See application file for complete search history.

(56) References Cited

U.S. PATENT DOCUMENTS 5,151,770 A     9/1992  Inoue
9,653,410 B1*   5/2017  Holmes ................. H01L 23/552
2011/0102077 A1* 5/2011 Lamey ................ H01L 23/4824
                                                           327/594

* cited by examiner

Primary Examiner — Marc Armand
Assistant Examiner — Sue Tang
(74) Attorney, Agent, or Firm — Charlene R. Jacobsen (57) ABSTRACT

A transistor includes a semiconductor substrate having an intrinsic active device, a first terminal, and a second terminal. The transistor also includes an interconnect structure formed of layers of dielectric material and electrically conductive material on the semiconductor substrate. The interconnect structure includes a pillar, a tap interconnect, and a shield structure positioned between the pillar and the tap interconnect formed from the electrically conductive material and extending through the dielectric material. The pillar contacts the first terminal and connects to a first runner. The tap interconnect contacts the second terminal and connects to a second runner. The shield structure includes a base segment, a first leg, and a second leg extending from opposing ends of the base segment, wherein the first and second legs extend from opposing ends of the base segment in a direction that is antiparallel to a length of the base segment.

16 Claims, 9 Drawing Sheets (51) Int. Cl.
*H03F 1/02* (2006.01)
*H03F 3/195* (2006.01)

FIG. 12

US 10,147,686 B1

TRANSISTOR WITH SHIELD STRUCTURE, PACKAGED DEVICE, AND METHOD OF MANUFACTURE

TECHNICAL FIELD OF THE INVENTION

The present invention relates generally to field effect transistors. More specifically, the present invention relates to a field effect transistor having a shield structure between the input and output of the active device, a packaged semiconductor device with the field effect transistor therein, and a method of manufacturing such a field effect transistor.

BACKGROUND OF THE INVENTION

A typical high power semiconductor device package may include one or more input leads, one or more output leads, one or more transistors, wirebonds coupling the input lead(s) to the transistor(s), and wirebonds coupling the transistor(s) to the output lead(s). A field effect transistor (FET) in such a high power semiconductor device package may include interdigitated drain and gate runners. The gate of the FET is driven by an input signal tapped from the gate runner. The tapping of the gate runner can add parasitic feedback capacitance that may reduce amplifier stability and reduce gain.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a transistor having a shield structure within an interconnect structure of the transistor, a packaged semiconductor device having such a transistor, and a method of manufacturing the transistor. More specifically, embodiments can include multiple shield structures strategically located along the runners of a multiple runner interdigitated transistor near positions where the input interconnections approach the output interconnections (tap locations). The shield structure has an approximately U-shaped or forked geometry formed in a layer of electrically conductive material and electrically conductive vias that extend through a dielectric material layer of the interconnect structure and connect to an underlying ground plane. The shield structure is configured to block electric fields between the input signal tapped from a runner and the output signal carried to another runner of the transistor. The geometry of the shield structure is configured to be small to minimize additional input and output capacitance contributions from the shield structure. The geometry of the shield structure effectively increases the gain of the active device (e.g., transistor) without degrading stability by reducing feedback capacitance.

The following description entails the implementation of a shield structure within an interconnect structure of a field effect transistor (FET) in a non-limiting fashion. Multiple shield structures may be strategically located along the gate runner of a multiple runner interdigitated FET and extending through the interconnect structure near positions where the input connections from a gate runner approach the output interconnections to a drain runner. It should be understood, however, that the shield structure may be implemented within a wide variety of unipolar and bipolar transistor technologies.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
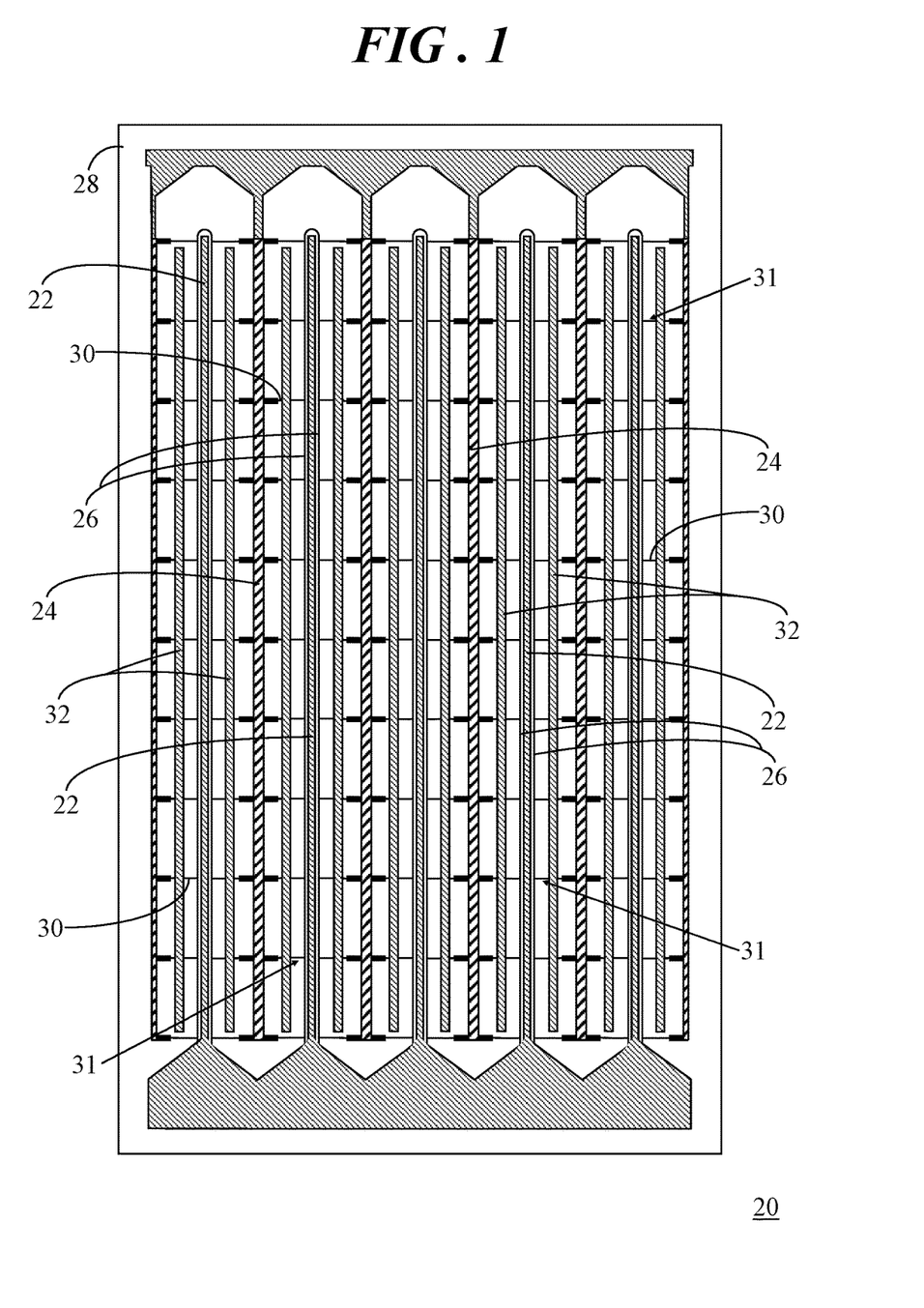
FIG. 1 shows a simplified top view of an example of a transistor having interdigitated drain and gate fingers.

FIG. 1 shows a simplified top view of an example of a transistor 20 having interdigitated drain and gate runners 22, 24. That is, drain and gate runners 22, 24 are closely positioned relative to one another in an alternating arrangement. Gates 26 generally surround drain regions (not visible) formed within a semiconductor substrate 28 of an intrinsic device underlying drain and gate runners 22, 24. Transistor 20 further includes a plurality of tap interconnects 30 formed from electrically conductive material, typically metal. Tap interconnects 30 are electrically connected between gate runners 24 and gate taps or gate electrodes of gates 26 formed within semiconductor substrate 28. The positions at which tap interconnects 30 are located are referred to herein as tap locations 31. Transistor 20 may include shield runners 32 interposed between each pair of drain and gate runners 22, 24 that may reduce some feedback capacitance between drain and gate runners 22, 24. The interdigitated drain, gate, and shield runners 22, 24, 32 may be formed in one or more metal layers above semiconductor substrate 28.

Figure 2:
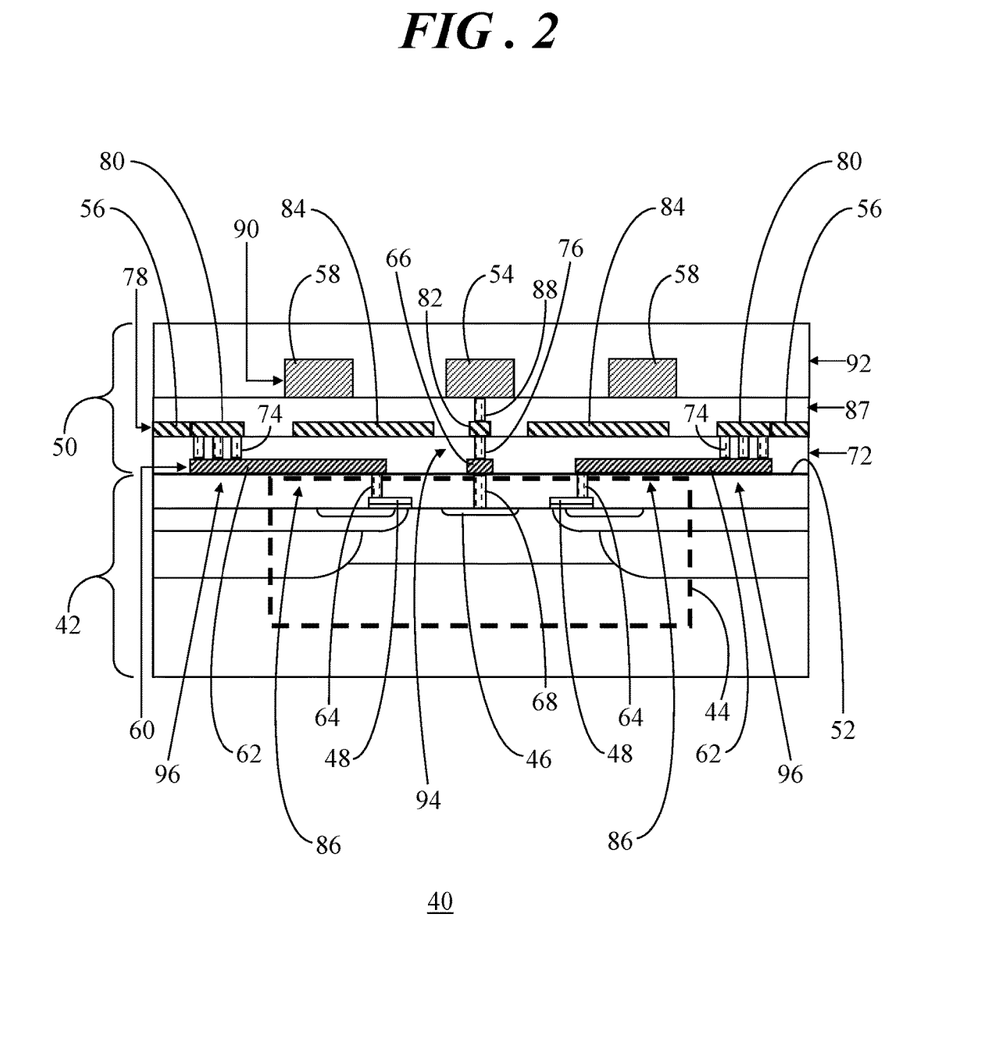
FIG. 2 shows a side sectional view of a portion of a transistor in accordance with an embodiment.

Referring now to FIG. 2, FIG. 2 shows a side sectional view of a portion of a transistor 40 in accordance with an embodiment. Transistor 40 includes a semiconductor substrate 42 having an intrinsic active device, e.g., a FET 44, formed therein, represented generally by a dashed line box. FET 44 within semiconductor substrate 42 includes, among other features, a first terminal, referred to herein as a drain region 46 and a second terminal, referred to herein as gate electrodes 48. Further details of FET 44 are known to those skilled in the art and are therefore not described herein for brevity. It bears repeating that although a FET design is discussed herein, a wide variety of unipolar and bipolar transistor technologies may alternatively be implemented.

An interconnect structure 50 is formed on an upper surface 52 of semiconductor substrate 42. In general, interconnect structure 50 of transistor 40 includes a plurality of interdigitated first and second runners, i.e., drain and gate runners 54, 56. Additionally, interconnect structure 50 includes a plurality of shield runners 58 interposed between each drain and gate runner 54, 56. Only a single drain runner 54, two gate runners 56, and two shield runners 58 are shown in the side sectional view of FIG. 2 for simplicity of illustration. It should be understood however, that transistor 40 may be configured to include the multiplicity of drain, gate, and shield runners as represented by transistor 20 in FIG. 1. Additionally, gate electrodes 48 may be structured on opposing sides of drain runners 54 as also shown in FIG. 1.

Interconnect structure 50 may be formed of multiple layers of dielectric material and electrically conductive material. In the illustrated configuration, a first conductive layer 60 (represented by dark upwardly and rightwardly directed narrow hatching) is suitably formed on upper surface 52 of semiconductor substrate 42 to include first tap interconnect segments 62 (two shown) electrically connected to gate electrodes 48 by way of electrically conductive vias 64, and first drain segments 66 (one shown) electrically connected to drain region 46 by way of an electrically conductive via 68. Additionally, a ground plane 70 (see FIG. 3) is formed in first conductive layer 60 on upper surface 52. Ground plane 70 will be described in significantly greater detail below. Of course, other structures may additionally be formed on upper surface 52 of semiconductor substrate 42 that are not illustrated herein for simplicity.

A first dielectric material layer 72 is formed over first conductive layer 60. Electrically conductive vias 74, 76 may be suitably formed extending through first dielectric material layer 72. By way of example, electrically conductive vias 74 extend through first dielectric material layer 72 and are in electrical contact with each of first tap interconnect segments 62. Likewise, electrically conductive via 76 extends through first dielectric layer 72 and is in electrical contact with first drain segments 66.

A second electrically conductive layer 78 (represented by downwardly and rightwardly directed wide hatching) is suitably formed on first dielectric material layer 72. Second electrically conductive layer 78 includes second tap interconnect segments 80 in electrical contact with conductive vias 74. Second electrically conductive layer 78 further includes a drain segment 82 in electrical contact with conductive via 76. Still further, second electrically conductive layer 78 includes a shield structure 84 interposed between second tap interconnect segments 80 and drain segment 82. In this illustrated configuration, second tap interconnect segments 80 serve as gate transmission lines interconnecting vias 74 with gate runners 56 also formed in second electrically conductive layer 78. Thus, collectively, first tap interconnect segment 62, vias 74, and second tap interconnect segment 80 yield individual tap interconnects 86 between vias 64/gate electrodes 48 and gate runners 56. Only two tap interconnects 86 are illustrated in FIG. 2 for clarity. However, it should be understood that transistor 40 may include a plurality of tap interconnects 86 in accordance with a configuration of interdigitated drain and gate runners like that shown in FIG. 1.

A second dielectric material layer 87 is formed over second tap interconnect segments 80, gate runners 56, drain segment 82, and shield structures 84 of second electrically conductive layer 78. In this example, an electrically conductive via 88 may be suitably formed extending through second dielectric material layer 87 and is in electrical contact with drain segment 82. A third electrically conductive layer 90 (represented by upwardly and rightwardly directed narrow hatching) is formed on second dielectric material layer 87. In this example, drain runner 54 and shield runners 58 are formed in third electrically conductive layer 90. Thereafter, a third dielectric material layer 92 may be formed over drain runner 54 and shield runners 58. Drain runner 54 is in electrical contact with electrically conductive via 88. Thus, collectively, the combination of first drain segment 66, via 76, second drain segment 82, and via 88 yield a drain pillar 94 for transistor 40 that electrically interconnects drain region 46/via 68 of intrinsic FET 44 to drain runner 54.

In general, gate electrodes 48 of intrinsic FET 40 are driven by an input signal tapped from gate runners 56 via tap interconnects 86 to gate electrodes 48 at tap locations 96. Thus, tap locations 96 are the positions where tap interconnects 86 approach drain pillar 94 within interconnect structure 50. The potential for undesirable feedback capacitance imposed upon the output metallization (i.e., drain pillar 94) from the input metallization (i.e., tap interconnects 86) is greatest at tap locations 96. That is, the input signal tapped from gate runners 56 can add parasitic feedback capacitance to an output signal from drain runner 54. This parasitic feedback capacitance can reduce amplifier stability and reduce gain.

Active devices used for RF power amplifier applications suffer from parasitic terminal capacitances that act to reduce RF bandwidth, degrade stability, and reduce gain. The inclusion of shield structures 84 described in detail below are strategically located along the gate finger of a multi-finger interdigitated transistor near positions where the input interconnections approach the output interconnections (e.g., at tap locations 96). Shield structures 84 can reduce an amount of feedback capacitance of the active intrinsic device (FET 44), effectively increasing amplifier gain without degrading amplifier stability.

Further, as illustrated above, interconnect structure 50 of transistor 40 includes three electrically conductive (e.g., metal) layers, with first conductive layer 60 residing closest to upper surface 52 of substrate 42 relative to second and third conductive layers 78, 90 and second conductive layer 78 being interposed between first and third conductive layers 60, 90. A minimal quantity of metal layers within interconnect structure 50 may enable a reduction in fabrication and material costs of interconnect structure 50 relative to interconnect structures having more than three metal layers. Additionally, the three metal layer implementation versus implementations with a greater quantity of metal layers may be beneficial in transistor technologies, such as in gallium nitride (GaN) based transistors. Shield structure 84 is connected to ground plane 70 underlying shield structure 84 and is strategically placed to block maximum coupling and is designed to yield maximum shielding with minimal degradation of other capacitances. Thus, shield structure 84 can be effectively implemented within the three metal layer design of interconnect structure 50. It should be understood however that shield structure 84 may be alternatively implemented for technologies with more than three metal layers.

Figure 3:
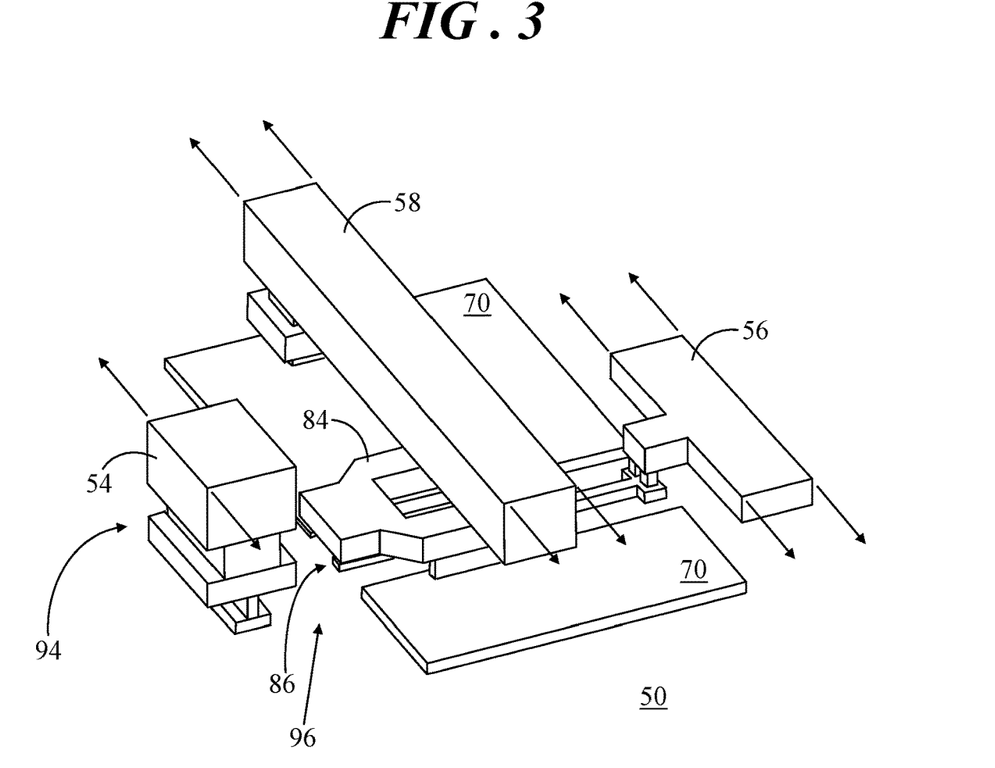
FIG. 3 shows a partial perspective view of an interconnect structure of FIG. 2.

FIG. 3 shows a partial perspective view of interconnect structure 50 of FIG. 2. More particularly, FIG. 3 shows one of tap locations 96 in which tap interconnect 86 is in proximity to drain pillar 94, with shield structure 84 strategically positioned between drain pillar 94 and tap interconnect 86. The various dielectric material layers surrounding drain pillar 94, shield structure 84, and tap interconnect 96 are not illustrated in FIG. 3 for clarity. Drain runner 54 is electrically connected to drain pillar 94, gate runner 56 is electrically connected to tap interconnect 86, and shield runner 58 (positioned between drain runner 54 and gate runner 56) is electrically connected to shield structure 84. Each of drain runner 54, gate runner 56, and shield runner 58 are illustrated with arrows pointing in opposing directions to signify that runners 54, 56, 58 extend in a lengthwise direction approximately parallel to one another.

Figure 4:
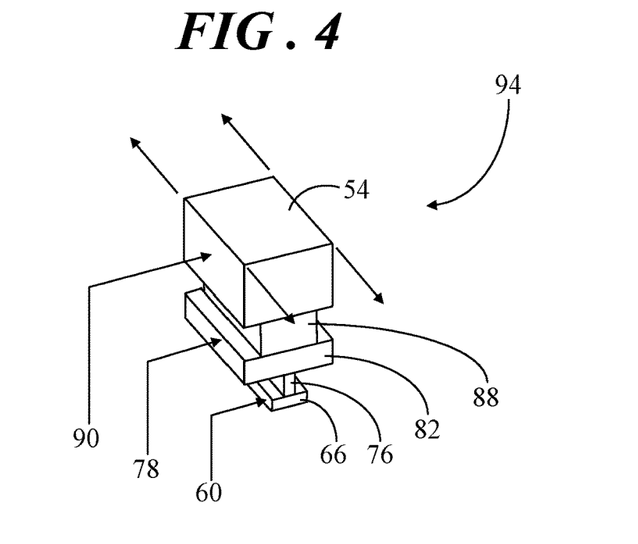
FIG. 4 shows a perspective view of a drain pillar within the interconnect structure.

FIG. 4 shows a perspective view of drain pillar 94 within interconnect structure 50 (FIG. 3). As shown, drain pillar 94 includes first drain segment 66 in first conductive layer 60. Second drain segment 82 in second electrically conductive layer 78 is connected to the underlying first drain segment 66 by conductive via 76. Drain runner 54 in third electrically conductive layer 90 is connected to the underlying second drain segment 82 by conductive via 88.

Figure 5:
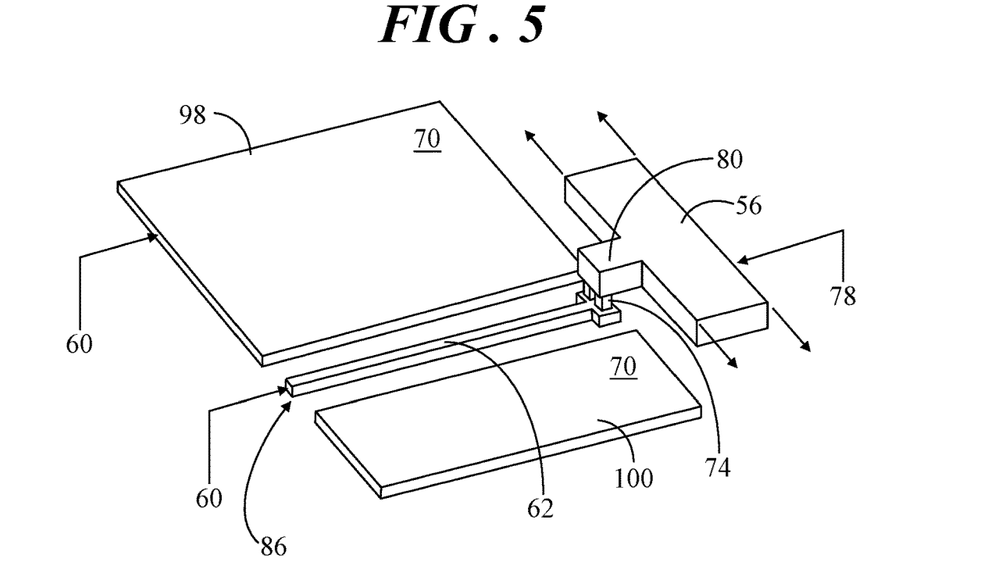
FIG. 5 shows a perspective view of a tap interconnect within the interconnect structure.

FIG. 5 shows a perspective view of a tap interconnect 86 within interconnect structure 50 (FIG. 3). As shown, first tap interconnect segment 62 is formed in first conductive layer 60. However, first tap interconnect segment 62 is laterally spaced apart from and therefore electrically isolated from the surrounding material of first conductive layer 60. This surrounding material is ground plane 70 of transistor 40 (FIG. 2). More particularly, ground plane 70 includes a first section 98 and a second section 100 formed in first conductive layer 60. First tap interconnect segment 62 is formed in first conductive layer 60 between first and second sections 98, 100 of ground plane 70 such that first and second sections 98, 100 are laterally spaced apart and electrically isolated from first tap interconnect segment 62 by first dielectric material layer 72 (FIG. 2). Second tap interconnect segment 80 (i.e., the gate finger), and therefore gate runner 56 in second conductive layer 78 is connected to the underlying first tap interconnect segment 62 by conductive vias 74.

Figure 6:
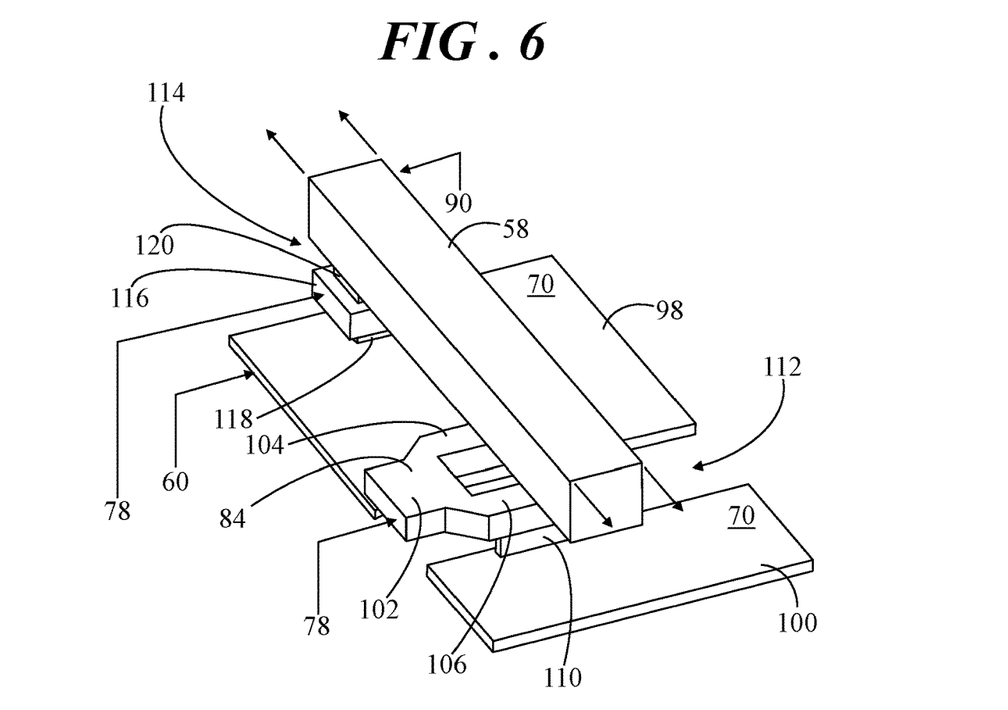
FIG. 6 shows a perspective view of a shield structure within the interconnect structure.
Figure 7:
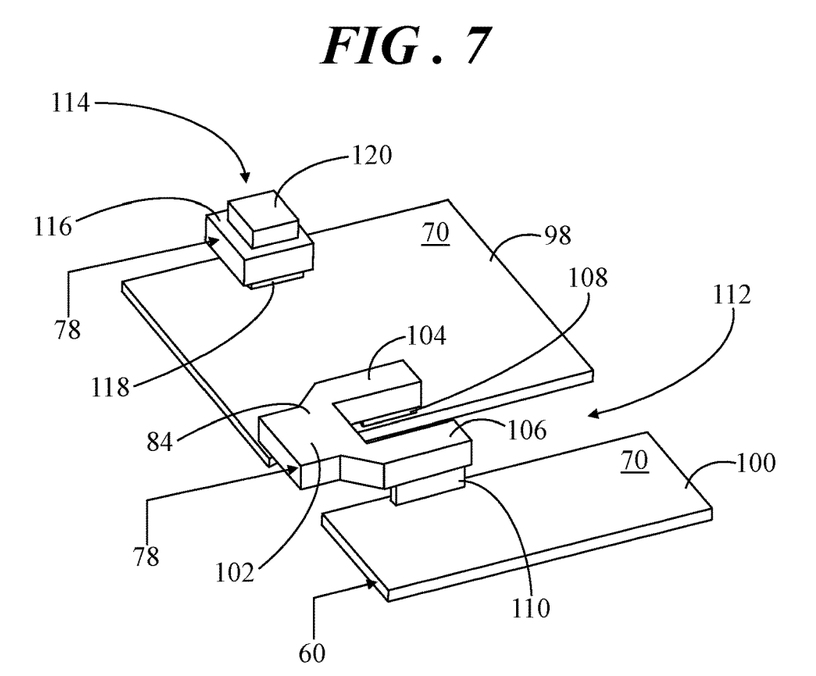
FIG. 7 shows another perspective view of the shield structure of FIG. 6 with a shield runner removed.

Referring to FIGS. 6 and 7, FIG. 6 shows a perspective view of shield structure 84 within interconnect structure 50 (FIG. 3) and FIG. 7 shows another perspective view of shield structure 84 with shield runner 58 removed in order to view the underlying structure. Shield structure 84 formed in second electrically conductive layer 78 includes a base segment 102, a first leg 104, and a second leg 106 in which the first and second legs 104, 106 extend from opposing ends of base segment in a direction that is antiparallel to a length of base segment 102. That is, all of base segment 102, first leg 104, and second leg 106 of shield structure 48 are formed in second conductive layer 78 to yield a shield structure 48 having an approximately U-shaped or forked geometry.

It should be recalled that first and second sections 98, 100 of ground plane 70 are formed in first electrically conductive layer 60. Shield structure 84, formed in second electrically conductive layer 78, is vertically spaced apart from first and second sections 98, 100 of ground plane 70. A first electrically conductive via 108 extending through first dielectric material layer 72 (FIG. 2) is coupled to each of first leg 104 and first section 98 of ground plane 70. Likewise, a second electrically conductive via 110 extending through first dielectric material layer 72 is coupled to each of second leg 106 and second section 100 of ground plane 70. As such, shield structure 48 bridges across a gap 112 between first and second sections 98, 100 in which first tap interconnect segment 62 (see FIG. 5) is located. Thus, first and second sections 98, 100 of ground plane 70 and shield structure 48 are electrically coupled by first and second vias 108, 110.

Interconnect structure 50 further includes one or more shield pillars 114 (one shown) that electrically interconnects shield runner 58 to ground plane 70. A shield segment 116 of shield pillar 114 may be formed in second electrically conductive layer 78. Shield segment 116 is interconnected to ground plane 70 by one or more electrically conductive vias 118. Additionally, shield segment is interconnected to shield runner 58 by one or more electrically conductive vias 120. Thus, shield pillar 114 extends through first and second dielectric material layers 72, 87 (FIG. 2) and electrically interconnects shield runner 58 with ground plane 70. Shield pillars 114 are displaced away from shield structures 48 and hence away from tap locations 96 (FIG. 3). Shield pillars 114 serve as shunts to ground plane 70 in order to suitably ground shield structures 48. However, shield pillars 114 are displaced away from tap locations 96 to minimize the potential for input and output capacitance contributions from shield pillars 114.

Figure 8:
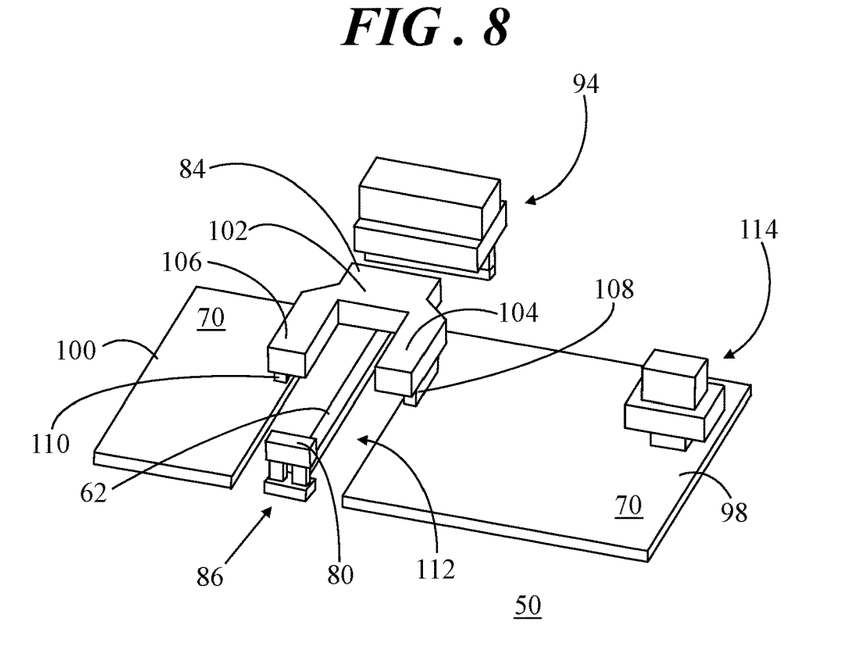
FIG. 8 shows another partial perspective view of the interconnect structure of FIG. 3.

FIG. 8 shows another partial perspective view of interconnect structure 50. As shown, first tap interconnect segment 62 of tap interconnect 86 is positioned in gap 112 between first and second sections 98, 100 of ground plane 70. Shield structure 84 overlies the portion of first tap interconnect segment 62 residing closest to drain pillar 94. Further, shield structure 84 bridges gap 112 with first via 108 interconnecting first leg 104 with first section 98 ground plane 70 and with second via 110 interconnecting second leg 106 with second section 100 of ground plane 70. Additionally, shield pillar 114 is interconnected with ground plane 70 and is displaced away from shield structure 84.

Figure 9:
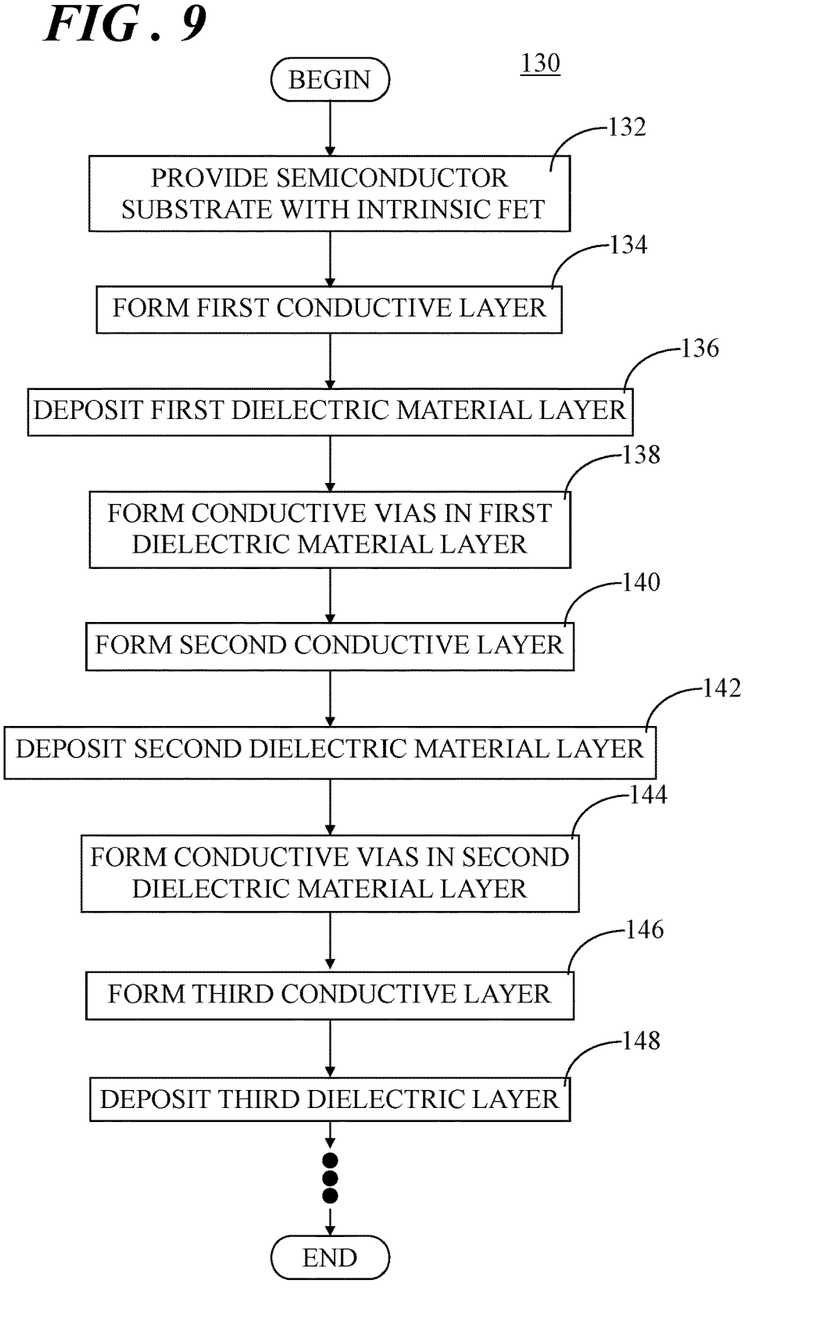
FIG. 9 shows a flowchart of a transistor manufacturing process in accordance with another embodiment.

FIG. 9 shows a flowchart of a transistor manufacturing process 130 in accordance with another embodiment. Transistor manufacturing process 130 may be implemented for fabricating one or more transistors, such as transistor 40 (FIG. 2) having a plurality of shield structures 84 (FIGS. 2 and 3) formed therein. For ease of explanation, FIGS. 2 and 3 should be viewed concurrently along with the ensuing description of transistor manufacturing process 130.

Process 130 may begin in a block 132 by providing a semiconductor substrate (e.g., semiconductor substrate 42) having one or more intrinsic active devices (e.g., FET 44) formed therein. The ensuing blocks 134-148 provide methodology for forming an interconnect structure (e.g., the three metal layer interconnect structure 50) having a plurality of shield structures (e.g., shield structures 84). In block 134, a first conductive layer (e.g., first electrically conductive layer 60) may be formed on an upper surface (e.g., upper surface 52) of the semiconductor substrate. For example, in block 134, a conductive material such as a metal layer may be suitably deposited, patterned, and etched to yield the desired structures (e.g., first tap interconnect segment 62, ground plane 70, and first drain segment 66) in first conductive layer 60. In a block 136, a dielectric material layer (e.g., first dielectric material layer 72) is deposited over the structures in the bottom conductive layer.

In a block 138, electrically conductive vias (e.g., vias 74, 76 of FIG. 2, and vias 108, 110, 118 of FIG. 7) extending through the first dielectric material layer are suitably produced by known and/or upcoming processes. In a block 140, a second conductive layer (e.g., second conductive layer 78) is formed on the first dielectric material layer. For example, in block 140, a conductive material such as a metal layer may be suitably deposited, patterned, and etched to yield the desired structures (e.g., second tap interconnect 80, shield structure 84, gate runner 56, drain segment 82, and shield segment 116 of FIG. 7). In a block 142, a second dielectric material layer (e.g., second dielectric material layer 87) is deposited over the structures in the second conductive layer. In a block 144, a "next" set of electrically conductive vias (e.g., conductive vias 88 of FIG. 2 and conductive vias 120 of FIG. 7) are formed extending through the dielectric material layer.

In a block 146, a third conductive layer (e.g., third conductive layer 90) is formed on the second dielectric material layer. For example, in block 146, a conductive material such as a metal layer may be suitably deposited, patterned, and etched to yield the desired structures (e.g., drain runners 54 and shield runners 58). In a block 148, a final dielectric layer (e.g., third dielectric layer 92) is deposited over the structure. Ellipses following block 148 indicate that other tasks may be performed such as testing, incorporating the transistor into a larger electrical system, and so forth.

Accordingly, this process flow continues in the three metal layer configuration shown in FIG. 2 until the three layers of electrically conductive material and dielectric material are suitably processed. Of course, it bears repeating that a configuration may include more than the three electrically conductive layers and three dielectric material layers shown and discussed herein, with the shield structure being directly coupled by way of electrically conductive vias to the underlying ground plane.

Figure 10:
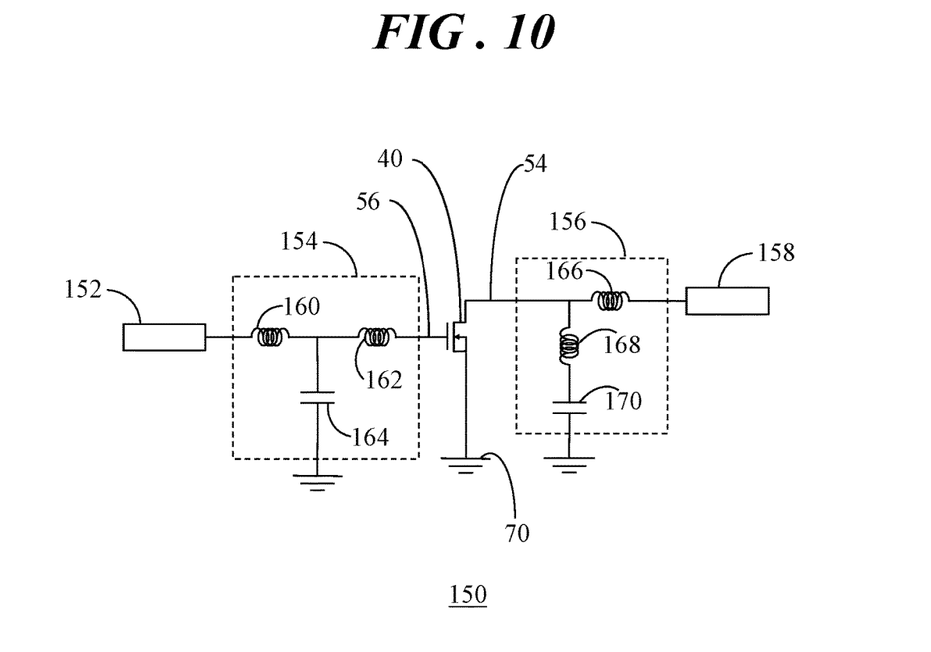
FIG. 10 shows a schematic diagram of amplifier path circuitry in which the transistor of FIG. 4 may be incorporated in accordance with an example embodiment.

Referring now to FIG. 10, FIG. 10 shows a schematic diagram of a device 150 including amplifier path circuitry in which transistor 40 may be incorporated in accordance with an example embodiment. Device 150 includes an input lead 152, an input impedance matching circuit 154, transistor 40, an output impedance matching circuit 156, and an output lead 158. Although transistor 40 and various elements of the input and output impedance matching circuits 154, 156 are shown as singular components, the depiction is for the purpose of ease of explanation only. Those of skill in the art would understand, based on the description herein, that transistor 40 and/or certain elements of the input and output impedance matching circuits 154, 156 each may be implemented as multiple components (e.g., connected in parallel or in series with each other). For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads).

Input lead 152 and output lead 158 each include a conductor, which is configured to enable device 150 to be electrically coupled with external circuitry (not shown). More specifically, input and output leads 152, 158 may be physically located between the exterior and the interior of the device's package. Input impedance matching circuit 154 is electrically coupled between input lead 152 and a first terminal of transistor 40, which is also located within the device's interior, and output impedance matching circuit 156 is electrically coupled between a second terminal of transistor 40 and the output lead 158.

According to an embodiment, transistor 40 is the primary active component of device 150. Transistor 40 includes a control terminal and two current conducting terminals, where the current conducting terminals are spatially and electrically separated by a variable-conductivity channel. For example, transistor 40 may be a field effect transistor (FET) (such as a metal oxide semiconductor FET (MOSFET)), which includes gate runners 56 (control terminal), drain runners 54 (a first current conducting terminal), and a source (a second current conducting terminal). According to an embodiment, and using nomenclature typically applied to MOSFETs in a non-limiting manner, the gate runners 56 of transistor 40 are coupled to input impedance matching circuit 154, drain runners 54 of transistor 40 are coupled to output impedance matching circuit 156, and the source of transistor 40 is coupled to ground plane 70 (or another voltage reference). Through the variation of input control signals provided to gate runners 56 of transistor 40, the current between the current conducting terminals of transistor 40 may be modulated.

Input impedance matching circuit 154 may be configured to raise the impedance of device 150 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 154 is coupled between input lead 152 and the control terminal (e.g., gate runners 56) of transistor 40. In an example, input impedance matching circuit 154 includes two inductive elements 160, 162 (e.g., two sets of wirebonds) and a shunt capacitor 164. A first inductive element 160 (e.g., a first set of wirebonds) is coupled between input lead 152 and a first terminal of capacitor 164, and a second inductive element 162 (e.g., a second set of wirebonds) is coupled between the first terminal of capacitor 164 and the control terminal (e.g., gate runners 56) of transistor 40. The second terminal of capacitor 164 is coupled to ground (or another voltage reference). Thus, the combination of inductive elements 160, 162 and shunt capacitor 164 functions as a low-pass filter.

Output impedance matching circuit 156 may be configured to match the output impedance of device 150 with the input impedance of an external circuit or component (not shown) that may be coupled to output lead 158. Output impedance matching circuit 156 is coupled between the first current conducting terminal (e.g., drain runners 54) of transistor 40 and output lead 158. In an example, output impedance matching circuit 156 includes two inductive elements 166, 168 (e.g., two sets of wirebonds) and one capacitor 170. A first inductive element 166 (e.g., a third set of wirebonds) is coupled between the first current conducting terminal (e.g., drain runners 54) of transistor 40 and output lead 158. A second inductive element 168 (e.g., a fourth set of wirebonds) is coupled between the first current conducting terminal (e.g., drain runners 54) of transistor 40 and a first terminal of capacitor 170. A second terminal of capacitor 170 is coupled to ground (or to another voltage reference). Inductor 168 and capacitor 170 are coupled in series between a current conducting terminal (e.g., drain runners 54) of transistor 40 and ground, and this combination of impedance matching elements functions as a high-pass matching stage.

Figure 11:
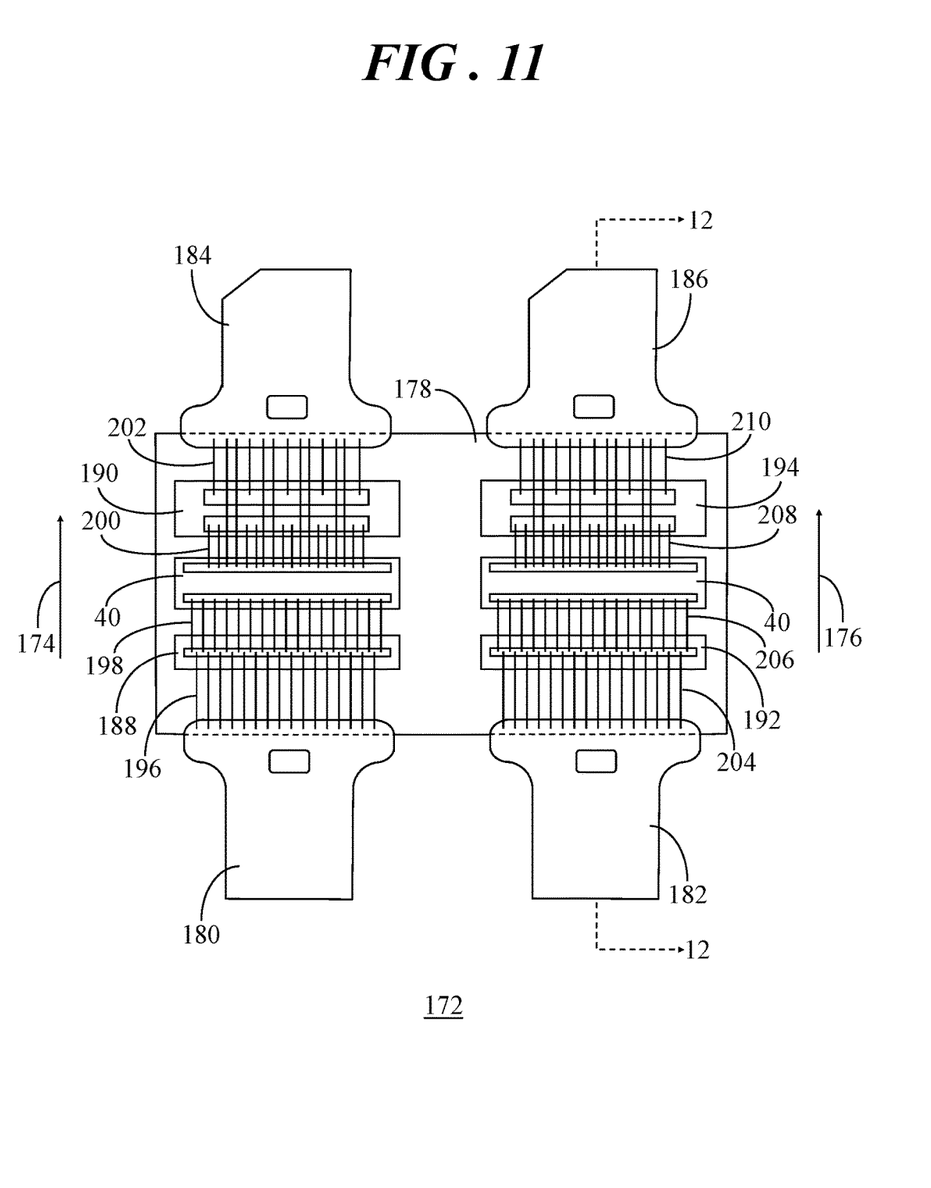
FIG. 11 shows a top view of an example of a packaged RF amplifier device incorporating the transistor of FIG. 4.
Figure 12:
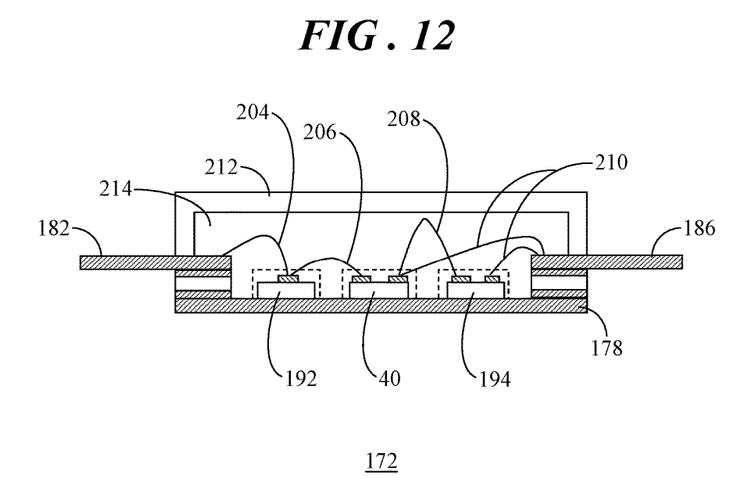
FIG. 12 shows a cross-sectional, side view of the packaged RF amplifier device of FIG. 11 along line 12-12.

Referring to FIGS. 11-12, FIG. 11 shows a top view of an example of a packaged RF amplifier device 172 incorporating transistor 40 and FIG. 12 shows a cross-sectional, side view of packaged RF amplifier device 172 along line 12-12 of FIG. 11. More specifically, packaged RF amplifier device 172 includes first circuitry associated with a first amplifier path 174 and second circuitry associated with a second amplifier path 176. First amplifier path 174 may be a carrier path of a Doherty amplifier and second amplifier path 176 may be a peaking path of the Doherty amplifier, for example. In alternate embodiments, amplifier paths 174, 176 can form portions of a different type of amplifier. In another alternate embodiment, second circuitry associated with second amplifier path 176 may be excluded from the device.

RF amplifier device 172 includes a device substrate 178, input leads 180, 182, output leads 184, 186, two transistor dies 40, and passive components 188, 190, 192, 194 coupled to the top surface of the device substrate 178. In addition, device 172 includes multiple sets of wirebonds 196, 198, 200, 202, 204, 206, 208, 210 that electrically interconnect the leads 180, 182, 184, 186, transistor dies 40, and components 188, 190, 192, 194. Each set of wirebonds 196, 198, 200, 202, 204, 206, 208, 210 is formed from a plurality of parallel, closely-spaced bonding wires. Although certain numbers and arrangements of wirebonds 196, 198, 200, 202, 204, 206, 208, 210 are depicted in FIG. 11, the numbers and/or arrangements of wirebonds may be different from that illustrated. Further, each set of wirebonds 196, 198, 200, 202, 204, 206, 208, 210 constitutes an inductive element, and therefore the wirebonds may be referred to below as "inductive elements" rather than "wirebonds." A cap 212 visible in FIG. 12 may be implemented in an air cavity package to seal the interior components of packaged RF amplifier device 172 within an air cavity 214 also visible in FIG. 12.

The amplifier path circuitry shown in FIG. 10 may be used as either of carrier path circuitry of first amplifier path 174 and/or as peaking path circuitry of second amplifier path 176. Thus, input lead 180, passive components 188, 190, one of transistors 40, inductive elements 196, 198, 200, 202, and output lead 184 of first amplifier path 174 can correspond to input lead 152, input impedance matching circuit 154, transistor 400, output impedance matching circuit 156 and output lead 158 of the amplifier path circuitry of device 150 of FIG. 10. Likewise, input lead 182, passive components 192, 194, one of transistors 40, inductive elements 204, 206, 208, 210, and output lead 186 of second amplifier path 176 can correspond to input lead 152, input impedance matching circuit 154, transistor 40, output impedance matching circuit 156 and output lead 158 of the amplifier path circuitry of device 150 of FIG. 10. Thus, further details of first and second amplifier paths 174, 176 are not provided herein for brevity.

Although embodiments have been described herein with respect to a Doherty power amplifier with one carrier amplifier and one peaking amplifier, those of skill in the art would understand, based on the description herein, that embodiments of the inventive subject matter may be used in conjunction with virtually any type of multiple path amplifier. Accordingly, the transistor having the shield structures described herein is not limited to use with Doherty amplifiers, nor is they limited to use with amplifiers having only two amplification paths. Rather, the transistor may be implemented within a wide variety of circuits.

An embodiment of a transistor comprises a semiconductor substrate having a first terminal and a second terminal, and an interconnect structure on an upper surface of the semiconductor substrate, the interconnect structure being formed of multiple layers of dielectric material and electrically conductive material. The interconnect structure comprises a pillar formed from the electrically conductive material, the pillar being in electrical contact with the first terminal, the pillar extending through the dielectric material, a tap interconnect formed from the electrically conductive material, the tap interconnect being in electrical contact with the second terminal, the tap interconnect extending through the dielectric material, and a shield structure formed from the electrically conductive material, the shield structure being positioned between the pillar and the tap interconnect and configured to block an electric field between the tap interconnect and the pillar. The shield structure includes a base segment, a first leg, and a second leg extending from opposing ends of the base segment, wherein the first and second legs extend from opposing ends of the base segment in a direction that is antiparallel to the base segment.

An embodiment of a packaged radio frequency (RF) amplifier device comprises a device substrate, an input lead coupled to the device substrate, an output lead coupled to the device substrate, and a transistor coupled to a top surface of the device substrate. The transistor includes a semiconductor substrate having a first terminal and a second terminal, and an interconnect structure on an upper surface of the semiconductor substrate, the interconnect structure being formed of multiple layers of dielectric material and electrically conductive material. The interconnect structure comprises a pillar formed from the electrically conductive material, the pillar being in electrical contact with the first terminal, the pillar extending through the dielectric material, a tap interconnect formed from the electrically conductive material, the tap interconnect being in electrical contact with the second terminal, the tap interconnect extending through the dielectric material, and a shield structure formed from the electrically conductive material, the shield structure being positioned between the pillar and the tap interconnect and configured to block an electric field between the tap interconnect and the pillar. The shield structure includes a base segment, a first leg, and a second leg extending from opposing ends of the base segment, wherein the first and second legs extend from opposing ends of the base segment in a direction that is antiparallel to the base segment.

An embodiment of a method of manufacturing a transistor comprises providing a semiconductor substrate having a first terminal and a second terminal and forming an interconnect structure on an upper surface of the semiconductor substrate of multiple layers of dielectric material and electrically conductive material. Forming the interconnect structure comprises forming a pillar from the electrically conductive material, the pillar electrically contacting the first terminal, the pillar extending through the dielectric material, forming a tap interconnect from the electrically conductive material, the tap interconnect electrically contacting the second terminal, the tap interconnect extending through the dielectric material, and forming a shield structure from the electrically conductive material, the shield structure being positioned between the pillar and the tap interconnect and configured to block an electric field between the tap interconnect and the pillar, the shield structure including a base segment, a first leg, and a second leg extending from opposing ends of the base segment, wherein the first and second legs extend from opposing ends of the base segment in a direction that is antiparallel to the base segment.

Accordingly, embodiments disclosed herein entail a transistor, having a shield structure within an interconnect structure of the transistor, a packaged semiconductor device having such a transistor, and a method of manufacturing the transistor. More specifically, embodiments can include multiple shield structures strategically located along the runners of a multiple runner interdigitated transistor near positions where the input interconnections approach the output interconnections (tap locations). The shield structure has an approximately U-shaped or forked geometry formed in a layer of electrically conductive material and electrically conductive vias that extend through a dielectric material layer of the interconnect structure and connect to an underlying ground plane. The shield structure is configured to block electric fields between the input signal tapped from a runner and the output signal carried to another runner of the transistor. The geometry of the shield structure is configured to be small to minimize additional input and output capacitance contributions from the shield structure. The geometry of the shield structure effectively increases the gain of the active device (e.g., transistor) without degrading stability by reducing feedback capacitance. The shield structure may be implemented within a wide variety of unipolar and bipolar transistor technologies. Additionally, the shield structure may be implemented within various interconnect structures for the transistors having more than or less than the quantity of electrically conductive and dielectric layers shown herein.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
   a semiconductor substrate having a first terminal and a second terminal; and
   an interconnect structure on an upper surface of the semiconductor substrate, the interconnect structure being formed of multiple layers of dielectric material and electrically conductive material, the interconnect structure comprising:
     a pillar formed from the electrically conductive material, the pillar being in electrical contact with the first terminal, the pillar extending through the dielectric material;
     a tap interconnect formed from the electrically conductive material, the tap interconnect being in electrical contact with the second terminal, the tap interconnect extending through the dielectric material; and
     a shield structure formed from the electrically conductive material, the shield structure being positioned between the pillar and the tap interconnect and configured to block an electric field between the tap interconnect and the pillar, the shield structure including a base segment, a first leg, and a second leg extending from opposing ends of the base segment, wherein the first and second legs extend from opposing ends of the base segment in a direction that is antiparallel to a length of the base segment, wherein the electrically conductive material of the interconnect structure comprises a first layer, a ground plane being formed in the first layer, and a second layer spaced apart from the first layer by a first dielectric material layer of the dielectric material, the shield structure being formed in the second layer, the first layer residing closest to the upper surface of the semiconductor substrate relative to the second layer, and a first conductive via extending through the first dielectric material layer to electrically interconnect the shield structure with the ground plane, and wherein the ground plane includes a first section and a second section formed in the first layer, a first tap interconnect segment of the tap interconnect is formed in the first layer between the first and second sections of the ground plane, and the first and second sections of the ground plane are laterally spaced apart and electrically isolated from the first tap interconnect segment by the dielectric material.

2. The transistor of claim 1 wherein all of the base segment, the first leg, and the second leg are formed in the second layer of the electrically conductive material.

3. The transistor of claim 1 wherein:
   the first conductive via is coupled to each of the first leg of the shield structure and the first section of the ground plane; and
   the transistor further comprises a second conductive via extending through the first dielectric material layer and coupled to each of the second leg of the shield structure and the second section of the ground plane.

4. The transistor of claim 1 wherein the tap interconnect further comprises:
   a second tap interconnect segment formed in the second layer of the electrically conductive material; and
   another conductive via extending through the first dielectric material layer and electrically interconnecting the first and second tap interconnect segments.

5. The transistor of claim 1 wherein the interconnect structure further comprises:
   a first runner electrically connected to the pillar;
   a second runner electrically connected to the tap interconnect; and
   a shield runner positioned between the first runner and the second runner, the shield runner being electrically connected to the shield structure.

6. The transistor of claim 5 wherein:
   the second runner is formed in the second layer; and
   the electrically conductive material of the interconnect structure further comprises a third layer spaced apart from the second layer by a second dielectric material layer of the dielectric material, wherein:
     the second layer is interposed between the first and third layers; and
     a second via extends through the first dielectric material layer to electrically interconnect the first tap interconnect segment with the second runner, and thereby electrically interconnect the second terminal with the second runner.

7. The transistor of claim 6 wherein the first runner is formed in the third layer of the electrically conductive material, and the pillar extends through the first and second dielectric material layers to electrically interconnect with the first runner, and thereby electrically interconnect the first terminal with the first runner.

8. The transistor of claim 6 wherein the shield runner is formed in the third layer of the electrically conductive material, and the interconnect structure further comprises a shield pillar extending through the first and second dielectric material layers and electrically interconnecting the shield runner with the ground plane, the shield pillar being displaced away from the shield structure.

9. The transistor of claim 5 wherein the interconnect structure further comprises:
   a plurality of tap interconnects contacting the second terminal and extending through the dielectric material, one of the plurality of tap interconnects being formed at each of a plurality of tap locations between the second terminal and the second runner; and
   a plurality of shield structures, wherein one of the plurality of shield structures is positioned at each of the plurality of tap locations.

10. The transistor of claim 1 wherein:
    the tap interconnect forms a portion of an input to the second terminal; and
    the pillar forms a portion of an output from the first terminal.

11. A packaged radio frequency (RF) amplifier device comprising:
    a device substrate;
    an input lead coupled to the device substrate;
    an output lead coupled to the device substrate; and
    a transistor coupled to a top surface of the device substrate, the transistor including:
       a semiconductor substrate having a first terminal and a second terminal; and
       an interconnect structure on an upper surface of the semiconductor substrate, the interconnect structure being formed of multiple layers of dielectric material and electrically conductive material, the interconnect structure comprising:
          a pillar formed from the electrically conductive material, the pillar being in electrical contact with the first terminal, the pillar extending through the dielectric material;
          a tap interconnect formed from the electrically conductive material, the tap interconnect being in electrical contact with the second terminal, the tap interconnect extending through the dielectric material; and
       a shield structure formed from the electrically conductive material, the shield structure being positioned between the pillar and the tap interconnect and configured to block an electric field between the tap interconnect and the pillar, the shield structure including a base segment, a first leg, and a second leg extending from opposing ends of the base segment, wherein the first and second legs extend from opposing ends of the base segment in a direction that is antiparallel to a length of the base segment, wherein the electrically conductive material of the interconnect structure comprises a first layer, a ground plane being formed in the first layer, and a second layer spaced apart from the first layer by a first dielectric material layer of the dielectric material, all of the base segment, the first leg, and the second leg of the shield structure being formed in the second layer, the first layer residing closest to the upper surface of the semiconductor substrate relative to the second layer, and a first conductive via extending through the first dielectric material layer to electrically interconnect the shield structure with the ground plane, and wherein the ground plane includes a first section and a second section formed in the first layer, a first tap interconnect segment of the tap interconnect is formed in the first layer between the first and second sections of the ground plane, and the first and second sections of the ground plane are laterally spaced apart and electrically isolated from the first tap interconnect segment by the dielectric material.

12. The packaged RF amplifier device of claim 11 wherein:
    the first conductive via is coupled to each of the first leg of the shield structure and the first section of the ground plane; and
    the transistor further comprises a second conductive via extending through the first dielectric material layer and coupled to each of the second leg of the shield structure and the second section of the ground plane.

13. The packaged RF amplifier device of claim 11 wherein the interconnect structure further comprises:
    a first runner electrically connected to the pillar;
    a second runner electrically connected to the tap interconnect; and
    a shield runner positioned between the first runner and the second runner, the shield runner being electrically connected to the shield structure.

14. The packaged RF amplifier device of claim 13 wherein:
    the second runner is formed in the second layer; and
    the electrically conductive material of the interconnect structure further comprises a third layer spaced apart from the second layer by a second dielectric material layer of the dielectric material, the first runner and the shield runner being formed in the third layer, wherein:
       second layer is interposed between the first and third layers;
       a second via extends through the first dielectric material layer to electrically interconnect the first tap interconnect segment with the second runner, and thereby electrically interconnect the second terminal with the second runner;
       the pillar extends through the first and second dielectric material layers to electrically interconnect with the first runner, and thereby electrically interconnect the first terminal with the first runner; and
       a shield pillar extends through the first and second dielectric material layers and electrically interconnects the shield runner with the ground plane, the shield pillar being displaced away from the shield structure.

15. A method of manufacturing a transistor comprising:
    providing a semiconductor substrate having a first terminal and a second terminal; and
    forming an interconnect structure on an upper surface of the semiconductor substrate of multiple layers of dielectric material and electrically conductive material, the forming the interconnect structure comprising:
       forming a pillar from the electrically conductive material, the pillar electrically contacting the first terminal, the pillar extending through the dielectric material;

forming a tap interconnect from the electrically conductive material, the tap interconnect electrically contacting the second terminal, the tap interconnect extending through the dielectric material;

forming a shield structure from the electrically conductive material, the shield structure being positioned between the pillar and the tap interconnect and configured to block an electric field between the tap interconnect and the pillar, the shield structure including a base segment, a first leg, and a second leg extending from opposing ends of the base segment, wherein the first and second legs extend from opposing ends of the base segment in a direction that is antiparallel to a length of the base segment; and forming a ground plane and a first tap interconnect segment of the tap interconnect in a first layer of the electrically conductive material, wherein the ground plane includes a first section and a second section formed in the first layer, the first tap interconnect segment is formed in the first layer between the first and second sections of the ground plane, and the first and second sections of the ground plane are laterally spaced apart and electrically isolated from the first tap interconnect segment by the dielectric material.

16. The method of claim 15 further comprising:

forming the shield structure and a second runner in a second layer of the electrically conductive material, the second layer being spaced apart from the first layer by a first dielectric material layer of the dielectric material;

forming a first runner and a shield runner in a third layer of the electrically conductive material, the third layer being spaced apart from the second layer by a second dielectric material layer of the dielectric material, wherein the first layer resides closest to the upper surface of the semiconductor substrate relative to the second and third layers and the second layer is interposed between the first and third layers;

forming a first via extending through the first dielectric material layer to electrically interconnect the shield structure with the ground plane;

forming a second via extending through the first dielectric material layer to electrically interconnect the first tap interconnect segment with the second runner and thereby electrically interconnect the second runner with the second terminal;

forming the pillar to extend through the first and second dielectric material layers to electrically interconnect the first runner with the first terminal;

forming a shield pillar extending through the first and second dielectric material layers to electrically interconnect the shield runner with the ground plane, the shield pillar being displaced away from the shield structure.

* * * * *